(12) United States Patent
Komiyama et al.

(10) Patent No.: US 9,117,743 B2
(45) Date of Patent: Aug. 25, 2015

(54) NITRIDE SEMICONDUCTOR SUBSTRATE

(71) Applicant: Covalent Materials Corporation, Tokyo (JP)

(72) Inventors: Jun Komiyama, Hadano (JP); Akira Yoshida, Tokyo (JP); Hiroshi Oishi, Hadano (JP)

(73) Assignee: COVALENT MATERIALS CORPORTION, Tokyo (JP)

( * ) Notice: Subject to any disclaimer, the term of this patent is extended or adjusted under 35 U.S.C. 154(b) by 0 days.

(21) Appl. No.: 14/271,521

(22) Filed: May 7, 2014

(65) Prior Publication Data

US 2014/0339679 A1    Nov. 20, 2014

(30) Foreign Application Priority Data

May 14, 2013    (JP) .................................. 2013-101761

(51) Int. Cl.
*H01L 29/12* (2006.01)
*H01L 29/20* (2006.01)
(Continued)

(52) U.S. Cl.
CPC ........ *H01L 29/2003* (2013.01); *H01L 21/0254* (2013.01); *H01L 21/0262* (2013.01); *H01L 21/02381* (2013.01); *H01L 21/02458* (2013.01); *H01L 21/02507* (2013.01);
(Continued)

(58) Field of Classification Search
CPC ...................... H01L 21/0254; H01L 21/02458; H01L 21/02456; H01L 21/02436; H01L 21/02439

USPC .......................... 257/200, 201, 341, 613, 615
See application file for complete search history.

(56) References Cited

U.S. PATENT DOCUMENTS 8,541,816 B2    9/2013    Hashimoto et al.
8,637,960 B2    1/2014    Abe et al.
(Continued)

FOREIGN PATENT DOCUMENTS

EP    2455964 A1    5/2012
JP    2005-286135 A    10/2005
(Continued)

OTHER PUBLICATIONS

Office Action issued on Dec. 1, 2014 in corresponding Japanese Patent Application No. 2013-101761. (3 pages).
(Continued)

*Primary Examiner* — Hsien Ming Lee
(74) *Attorney, Agent, or Firm* — Buchanan, Ingersoll & Rooney PC

(57) ABSTRACT

A nitride semiconductor substrate suitable for a high withstand voltage power device is provided in which current collapse is controlled, while reducing leakage current. In a nitride semiconductor substrate, wherein a buffer layer, an active layer, and an electron supply layer, each comprising a group 13 nitride, are stacked one by one on a silicon single crystal substrate, the buffer layer has a structure where a multilayer stack in which a pair of nitride layers having different concentrations of Al or Ga are repeatedly deposited a plurality of times on an initial layer of $Al_xGa_{1-x}N$ ($0 \leq x \leq 1$) is stacked, and includes a doping layer whose carbon concentration is $1 \times 10^{18}$ to $1 \times 10^{21}$ cm$^{-3}$ and whose Si concentration is $1 \times 10^{17}$ to $1 \times 10^{20}$ cm$^{-3}$, a thickness of the doping layer is 15% or more of the total thickness of the buffer layer.

4 Claims, 2 Drawing Sheets

(51) Int. Cl.
*H01L 21/3205* (2006.01)
*H01L 29/10* (2006.01)
*H01L 21/02* (2006.01)
*H01L 29/778* (2006.01)

(52) U.S. Cl.
CPC ... *H01L 21/02576* (2013.01); *H01L 21/02579* (2013.01); *H01L 29/1075* (2013.01); *H01L 29/7786* (2013.01)

(56) References Cited

U.S. PATENT DOCUMENTS

| | | |
|---|---|---|
| 8,860,038 B2 | 10/2014 | Iwami et al. |
| 2010/0230687 A1 | 9/2010 | Hashimoto et al. |
| 2012/0091435 A1 | 4/2012 | Ikuta et al. |
| 2012/0168719 A1 | 7/2012 | Ikuta et al. |
| 2012/0211763 A1* | 8/2012 | Yoshida et al. ............. 257/76 |
| 2012/0322245 A1 | 12/2012 | Ohno |

FOREIGN PATENT DOCUMENTS

| | | |
|---|---|---|
| JP | 2007-251144 A | 9/2007 |
| JP | 2009-117482 A | 5/2009 |
| JP | 2009-252756 A | 10/2009 |
| JP | 2010-045416 | 2/2010 |
| JP | 2012-174697 A | 9/2012 |
| JP | 2013-004681 A | 1/2013 |
| JP | 2013-069714 A | 4/2013 |
| JP | 2013-080776 A | 5/2013 |
| WO | WO 2012/157371 A1 | 11/2012 |

OTHER PUBLICATIONS

Combined Search and Exam Report dated Oct. 7, 2014, issued by the British Patent Office in the corresponding British Application No. 1407750.7 (7pages).

* cited by examiner

NITRIDE SEMICONDUCTOR SUBSTRATE

BACKGROUND OF THE INVENTION

1. Field of the Invention

The present invention relates to a nitride semiconductor substrate comprising a group 13 nitride and suitably used for a semiconductor power device.

2. Description of the Related Art

Group 13 nitride semiconductors including GaN attract attention as next-generation semiconductor power device materials. In particular, a nitride semiconductor substrate having grown a group 13 nitride semiconductor crystal epitaxially on a substrate of different materials, such as sapphire, silicon, etc., has many advantages in respect of the balance between a device property and manufacturing cost. Especially, one that uses a silicon substrate which allows a diameter of 6 inches is very useful industrially.

Incidentally, it is known that a phenomenon called current collapse (also called a current slump) arises in a nitride semiconductor power device. "Current collapse" is a phenomenon where when current is switched from OFF to ON, it acts as if resistance of a channel increased, and conduction current decreased.

It is generally said that the cause of current collapse relates to electron trapping in the defects at the outermost surface of the device or the defects in the buffer layer. As a measure for improving such current collapse, outermost surface passivation by a SiNx film etc., a field plate structure for reducing intensive electric field, etc. are known (for example, see Japanese Patent Application Publication No. 2005-286135 (Patent Literature 1) and a Japanese Patent Application Publication No. 2009-252756 (Patent Literature 2)).

Further, a deep level defect formed by residual carbon in this buffer layer is known as a carrier trap site in the buffer layer relevant to current collapse. On the other hand, residual carbon compensates for residual donor in a GaN-type semiconductor crystal, and allows this crystal to have high resistance. Thus, how to form a buffer layer caused to have high resistance by doping has also been examined. For example, Japanese Patent Application Publication No. 2007-251144 (Patent Literature 3) discloses the formation of the buffer layer including the nitride semiconductor layer doped with carbon within a range which does not adversely affect the current collapse.

Furthermore, Japanese Patent Application Publication No. 2012-174697 (Patent Literature 4) discloses that a nitride semiconductor layer is stacked on a substrate through a buffer layer where n-type GaN is doped with carbon, so that a position for taking a carbon atom is controlled, a carrier is compensated effectively, and the buffer layer of high resistance can be formed.

However, as disclosed in Patent Literature 3 above, it is preferable that the concentration of the above-mentioned residual carbon is lower in order to control the current collapse. On the other hand, residual carbon causes the GaN-type semiconductor crystal to have high resistance, and serves to reduce the leakage current from the device. That is to say, when controlling the residual carbon concentration in the buffer layer, there is a trade-off between the current collapse property and the leakage current reduction. Thus, it is not necessarily easy to improve the current collapse property and the leakage property and satisfy both simultaneously only by doping the buffer layer with carbon.

Furthermore, even by the method in which the buffer layer comprising Si-doped n-type GaN is doped with carbon as disclosed in Patent Literature 4 above, it is difficult to obtain the nitride semiconductor substrate which can fully satisfy the high withstand voltage property, while satisfying both the current collapse property and the leakage property.

Therefore, in order to realize the nitride semiconductor electron device with high withstand voltage by doping, there is a need for a means for controlling the current collapse by a method other than the method for controlling a carbon concentration in the buffer layer doped with carbon.

SUMMARY OF THE INVENTION

The present invention has been made in order to solve the above-mentioned technical problems and aims to provide a nitride semiconductor substrate which reduces leakage current, controls current collapse, and is suitable for a high withstand voltage power device.

The nitride semiconductor substrate in accordance with the present invention is characterized in that a buffer layer, an active layer, and an electron supply layer, each comprising a group 13 nitride, are stacked one by one on a silicon single crystal substrate, the above-mentioned buffer layer has a structure where a multilayer stack in which a pair of nitride layers having different concentrations of Al or Ga are repeatedly deposited a plurality of times on an initial layer of $Al_xGa_{1-x}N$ (0≤x≤1) is stacked, and includes a doping layer whose carbon concentration is $1\times10^{18}$ to $1\times10^{21}$ cm$^{-3}$ and whose Si concentration is $1\times10^{17}$ to $1\times10^{20}$ cm$^{-3}$, and a thickness of the above-mentioned doping layer is 15% or more of the total thickness of the above-mentioned buffer layer.

By forming such a buffer layer, it is possible to control the current collapse, while reducing the leakage current.

It is preferable that the doping layer of the above-mentioned nitride semiconductor substrate has a multilayer structure where a pair of nitride layers having different concentrations of Al or Ga are repeatedly deposited a plurality of times. Further, it is preferable that an oxygen concentration in the above-mentioned buffer layer is $5\times10^{17}$ to $5\times10^{18}$ cm$^{-3}$.

According to the present invention, it is possible to obtain the nitride semiconductor substrate in which reduction in leakage current is attained by forming the doping layer in the buffer layer containing carbon at a predetermined concentration and the current collapse is controlled.

Therefore, the nitride semiconductor substrate in accordance with the present invention can be suitably used as a substrate of a high withstand voltage power device.

DESCRIPTION OF THE PREFERRED EMBODIMENTS

Hereinafter, the present invention will be described in detail with reference to the drawings.

Figure 1:
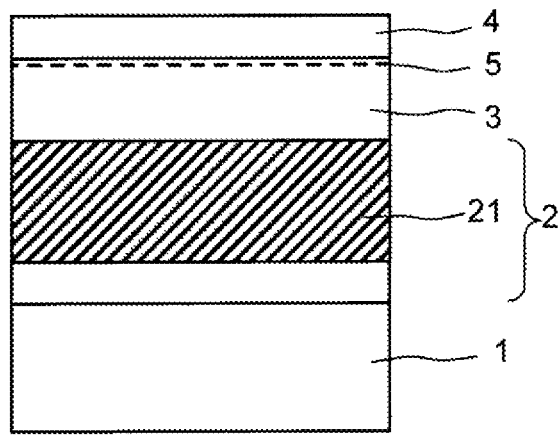
FIG. 1 is a schematic sectional view showing an example of a layer structure of a nitride semiconductor substrate in accordance with the present invention.

FIG. 1 shows an example of a layer structure of a nitride semiconductor substrate in accordance with the present invention. The nitride semiconductor substrate shown in FIG. 1 is provided with a structure in which a buffer layer 2, an active layer 3, and an electron supply layer 4 are stacked one by one on a silicon single crystal substrate 1. The buffer layer 2, the active layer 3, and the electron supply layer 4 each comprise a group 13 nitride. Further, a doping layer 21 which contains carbon at a concentration of $1 \times 10^{19}$ to $1 \times 10^{21}$ cm$^{-3}$ and Si at a concentration of $1 \times 10^{17}$ to $1 \times 10^{20}$ cm$^{-3}$ is inserted into the buffer layer 2. It should be noted that a two-dimensional electron gas layer 5 formed directly under an interface between the active layer 3 and the electron supply layer 4 serves as a channel in a high-electron mobility transistor (HEMT).

Herein, by "group 13 nitride", we mean boron nitride, aluminum nitride, gallium nitride, indium nitride, or thallium nitride. It is not restricted to the nitride of one element and may be a mixed nitride which contains two or more elements. As typical examples, there may be mentioned AlN, GaN, AlGaN, etc. and a ratio of the respective components can be varied.

Figure 2:
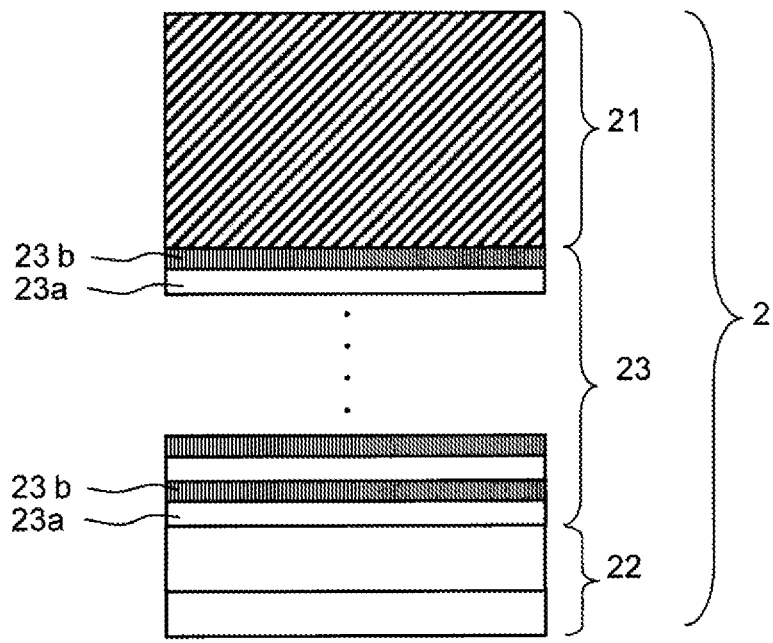
FIG. 2 is an enlarged sectional view for explaining a buffer layer in the present invention in detail.

An example of a layer structure of the buffer layer 2 is shown in FIG. 2. The buffer layer 2 is not a single layer but has a structure where a multilayer stack 23 is stacked on an initial layer 22 of $Al_xGa_{1-x}N$ ($0 \leq x \leq 1$).

The initial layer 22 of $Al_xGa_{1-x}N$ ($0 \leq x \leq 1$) has the effect of improving evenness of an interface between itself and the nitride layer stacked thereon. This initial layer 22 may be of a single layer or of a two-layer structure in which two layers of $Al_xGa_{1-x}N$ ($0 \leq x \leq 1$) where x values are different from each other are stacked.

The multilayer stack 23 formed on the initial layer 22 is formed in such a manner that a pair of an alternating layer 23a and an alternating layer 23b which are nitride layers having different concentrations of Al or Ga are repeatedly stacked a plurality of times. With such an arrangement, the warp and a dislocation density of the nitride semiconductor substrate can be reduced effectively.

It should be noted that, the buffer layer 2 constituted by the initial layer 22 and the multilayer stack 23 is not limited to the layer structure as shown in FIG. 2, but the composition, film thickness, the number of times the pair of nitride layers (alternating layers 23a and 23b) are repeated, etc. can be suitably set up according to the use, the purpose, etc. of the nitride semiconductor substrate. For example, it is possible to employ a structure in which a single layer of a nitride semiconductor is formed on the multilayer stack 23, and another multilayer stack is stacked thereon.

Further, the doping layer 21 is inserted into the buffer layer 2. A carbon concentration in this doping layer 21 is $1 \times 10^{19}$ to $1 \times 10^{21}$ cm$^{-3}$, and a Si concentration is $1 \times 10^{17}$ to $1 \times 10^{20}$ cm$^{-3}$.

It should be noted that the concentration of each of these elements can be measured by a secondary ion mass analysis method (SIMS), for example.

Carbon contained in the doping layer 21 serves to increase resistance of the group 13 nitride and reduce leakage current.

In the case where the above-mentioned carbon concentration is less than $1 \times 10^{19}$ cm$^{-3}$, the leakage current is not fully reduced. On the other hand, in the case where it exceeds $1 \times 10^{21}$ cm$^{-3}$, a density of defects in the group 13 nitride increases, leading to increase in the leakage current resulting from poor crystallinity or the defects.

Si contained in the doping layer 21 acts as a donor impurity, and has the role of electrically compensating for the defects caused by carbon contained at a high concentration, thus having the effect of controlling current collapse which becomes apparent due to the presence of lots of defects above.

In the case where the above-mentioned concentration is less than $1 \times 10^{17}$ cm$^{-3}$, the current collapse cannot fully be controlled. On the other hand, in the case where it exceeds $1 \times 10^{20}$ cm$^{-3}$, Si itself which is a donor impurity inhibits high resistance and therefore cannot fully reduce the leakage current.

It should be noted that, as for the above-mentioned carbon concentration and Si concentration, an average concentration in the whole doping layer 21 may only be within the above-defined range, and may not necessarily be uniform over the whole doping layer 21. For example, it may be a concentration profile where it gradually increases or gradually decreases in the thickness direction like a straight line, like a secondary function, or like stairs.

Further, a thickness of the doping layer 21 is set as 15% or more of the whole thickness of the buffer layer 2.

If a ratio of the thickness of the doping layer 21 to the whole buffer layer 2 is large, the significant effect of allowing the reduction in leakage current to be compatible with the control of current collapse can be obtained.

If the above-mentioned ratio of thickness is less than 15%, it is not possible to obtain sufficient effects. Preferably, it is 50% or more.

More preferably, the ratio of the thickness of the doping layer 21 to the whole thickness of the buffer layer 2 is 85% to 95%, and at least one of an interface between the silicon single crystal substrate 1 and the buffer layer 2 and an interface between the buffer layer 2 and the active layer 3 are constituted by a group 13 nitride layer which is different from the doping layer 21.

This is because the doping layer 21 containing both carbon and Si at high concentrations acts disadvantageously in terms of deterioration of the crystallinity, and in particular, there is a possibility of increasing the generation of dislocation and adversely affecting the substrate property at the interface where the doping layer 21 is in contact with a layer having a small amount of dopants.

Examples of arrangements of the doping layer 21 in the buffer layer 2 are shown in FIGS. 3A to 3D. The doping layer 21 can be formed in any position in the thickness direction other than the examples as shown in FIG. 3.

It is preferable that the doping layer 21 has a multilayer stack structure in which a pair of nitride layers having different concentrations of Al or Ga are repeatedly deposited a plurality of times. In other words, it is preferable that a part of the multilayer stack 23 is the doping layer 21 with a predetermined carbon concentration and a predetermined Si concentration.

With such arrangements, the doping layer 5 itself demonstrates the effect of reducing the warp and the effect of controlling the propagation of dislocations due to the multilayer stack structure; the warp controllability of the whole nitride semiconductor substrate can be improved; the substrate with fewer dislocations can be obtained. Further, the nitride layer containing both carbon and Si at high concentrations promotes the bowing effect of penetration dislocation etc., thus being advantageous in reducing the leakage current.

Furthermore, it is preferable that an oxygen concentration of the buffer layer 2 is $5 \times 10^{17}$ to $5 \times 10^{18}$ cm$^{-3}$.

Conventionally, it is said that since the oxygen in the group 13 nitride adversely affects the current leakage, its concentration is preferably as low as possible.

However, in the group 13 nitride containing both carbon and Si at high concentrations, the defects generated by the presence of carbon and Si worsen the current collapse, and it is thought that the current collapse is reduced by the presence of oxygen at a predetermined concentration. That is to say, oxygen contained in the buffer layer 2 contributes to controlling the current collapse. In particular, in the case where both are contained at high concentrations like the doping layer 21, the effect of controlling the current collapse is more enhanced than in the case where either carbon or Si is contained at a high concentration.

In the case where the above-mentioned oxygen concentration is less than $5 \times 10^{17}$ cm$^{-3}$, which is in the minimum measurement range of SIMS, it is difficult to control the concentration. In addition, in order to maintain the oxygen concentration with sufficient accuracy, particular film forming conditions must be employed, and there is a possibility of worsening the productivity and film quality, etc. On the other hand, in the case where it is greater than $5 \times 10^{18}$ cm$^{-3}$, the adverse affect on the current collapse due to excessive oxygen becomes significant.

It is preferable that the above-mentioned oxygen concentration is $5 \times 10^{17}$ to $8 \times 10^{17}$ cm$^{-3}$.

It should be noted that as for the above-mentioned oxygen concentration, an average concentration in the whole buffer layer 2 may only be within the above-defined range, and may not necessarily be uniform over the whole buffer layer 2. For example, it may be a concentration profile where it gradually increases or gradually decreases in the thickness direction like a straight line, like a secondary function, or like stairs. Further, oxygen may be contained only in the initial layer 22 and the multilayer stack 23 other than the doping layer 21. Alternatively, it is possible to employ arrangements in which a region where oxygen concentration is high and a region where it is low are repeated alternately in the thickness direction of the buffer layer 2, or a layer formed under the film forming conditions where the oxygen concentration is difficult to decrease is inserted into a part of the buffer layer 2.

With such a layer structure, even if the effect of reducing the warp or dislocation by the inserted functional layer is influenced by the oxygen concentration, it is possible to obtain the effect of controlling the current collapse by a predetermined oxygen concentration in the buffer layer 2.

As described above, as for the buffer layer 2 which includes the doping layer 21 made of a group 13 nitride and containing carbon, Si, and oxygen at predetermined concentrations, high resistance caused by carbon, electric compensation for the defects caused by Si (which is a donor impurity), and control of the current collapse caused by oxygen co-operate suitably, thus it is possible to obtain the nitride semiconductor substrate which allows low leakage and control the current collapse as a whole.

As for the layers other than the doping layer 21, in the buffer layer 2, it is preferable that at least one of the Si concentration and the oxygen concentration is out of the above-mentioned range which defines the doping layer 21 or the buffer layer 2.

However, in terms of reducing the leakage current, it is preferable that the buffer layer 2 has high resistance to some extent as a whole. Therefore, the carbon concentration is preferably the carbon concentration within the range as defined for the doping layer 21. If this is the case, both the Si concentration and oxygen concentration are preferably lower than the above-mentioned range in terms of reducing the dislocations.

The method of manufacturing the silicon single crystal substrate 1 is not particularly limited. It may be manufactured by the Czochralski (CZ) method, or may be manufactured by the floating zone (FZ) method. Further, a silicon single crystal layer may be epitaxially grown on these silicon single crystal substrates by the chemical vapor deposition method (silicon epitaxial substrate). Furthermore, a silicon oxide film, a nitride film, etc. maybe formed on the back of the silicon single crystal substrate 1. This underside film may suitably be removed after forming the electron supply layer 4.

Although each layer of the above-mentioned nitride semiconductor substrate is usually formed by the epitaxial growth, it is not particularly limited, and conventionally used methods may be employed. For example, it is possible to use the CVD methods including MOCVD (Metal Organic Chemical Vapor Deposition) and PECVD (Plasma Enhanced Chemical Vapor Deposition), a deposition method using a laser beam, a sputtering method using atmosphere gas, MBE (Molecular Beam Epitaxy) using a molecular beam in a high vacuum, and MOMBE (Metal Organic Molecular Beam Epitaxy) which combines MOCVD and MBE.

Further, the materials used when epitaxially growing the layers are not limited to those used in the following Examples, either. For instance, the source gases for causing the layer to contain carbon may be acetylene, ethane, propane, trimethyl aluminum, and trimethyl gallium in addition to methane. Furthermore, the source gases for the layer to contain Si may be mono-silane, or monomethyl-silane.

It should be noted that the oxygen concentration is controlled by adjusting the pressure and a source gas flow rate at the time of the chemical vapor deposition, but not limited to, in the following Examples.

Further, formation or processing of the electrodes when producing the nitride semiconductor device using the above-mentioned nitride semiconductor substrate in accordance with the present invention is not particularly limited, but can be carried out a conventional method. For example, it is possible to form the electrodes on the surface and the back of the above-mentioned substrate with a known material by vacuum deposition or lithography.

EXAMPLES

Hereinafter, the present invention will be described more particularly with reference to Examples, but the present invention is not limited the following Examples.

Experiment 1

A nitride semiconductor substrate having a layer structure as shown in FIG. 1 was prepared according to the following processes.

First, a silicon (111) single crystal substrate 1 with a diameter of 6 inches was placed in an MOCVD apparatus.

Then, an AlN single crystal layer with a thickness of 150 nm was formed at 1100° C. by chemical vapor deposition, using trimethyl aluminum (TMA) and ammonia (NH$_3$) as raw materials. Further, an AlGaN single crystal layer with a thickness of 200 nm was stacked using trimethyl gallium (TMG), TMA and NH$_3$ as raw materials, at 1000° C. by chemical vapor deposition, to form an initial layer 22.

On the initial layer, a pair of an AlN single crystal layer with a thickness of 5 nm and a GaN single crystal layer with a thickness of 50 nm were repeatedly stacked to form a multilayer stack 23 where 30 layers for each (60 layers in total) were alternately and repeatedly deposited. The oxygen concentration in the initial layer 22 and the multilayer stack 23 was $1 \times 10^{17}$ cm$^{-3}$. In addition, adjustment of Si concentration was performed by using a mono-silane (SiH$_4$) as a raw material as needed.

On the multilayer stack 23, the doping layer 21 of a GaN single crystal layer with a thickness of 1000 nm was stacked using TMG, NH$_3$, and SiH$_4$ as raw materials and respectively adjusting the carbon and Si concentrations of each sample so as to be those listed in Table 1 below.

According to the above-mentioned processes, the buffer layer 2 constituted by the initial layer 22, the multilayer stack 23, and the doping layer 21 was formed.

Next, using TMG and $NH_3$ as raw materials, the active layer 3 made of a GaN single crystal and having a thickness of 1500 nm was stacked on the buffer layer 2 by the chemical vapor deposition at 1000° C. On the active layer 3, the electron supply layer 4 made of an $Al_{0.25}Ga_{0.75}N$ single crystal layer and having a thickness of 30 nm was stacked using TMG, TMA, and $NH_3$ as raw materials. The active layer 3 and the electron supply layer 4 were arranged to have a carbon concentration of $1\times10^{17}$ $cm^{-3}$ and an oxygen concentration of $1\times10^{17}$ $cm^{-3}$.

It should be noted that a thickness of each layer formed by the chemical vapor deposition, a carbon concentration, a Si concentration, and an oxygen concentration were controlled by adjusting the amount of supply of raw materials, supply time, a substrate temperature, etc.

A source electrode, a gate electrode, and a drain electrode (neither is illustrated) were formed on the electron supply layer 4 using titanium (Ti), aluminum (Al), nickel (Ni), and gold (Au), to produce a HEMI element.

As for each of the thus prepared HEMI elements as shown in Table 1 below, a voltage was applied across source-drain electrodes and a voltage was applied to a gate electrode using a curve tracer, and a leakage property and a collapse property were measured and evaluated.

The leakage property was determined by the withstand voltage; a withstand voltage of less than 450 V for a threshold current density of 100 µA/mm² was determined as "poor"; one that was between 450 V and 600 V (inclusive) was determined as "good"; one that was greater than 600 V was determined as "excellent".

The current collapse property was determined such that a predetermined stress voltage was applied across source-drain electrodes in an OFF state, a constant called a collapse factor was calculated from a ratio between the amounts of conduction current in an ON state before and after the application, and then evaluated. The collapse factor shows that the closer to 1.0 the value, the smaller the conduction loss of the element. A collapse factor of from 0.7 to 1.0 was determined as "excellent"; one that was from 0.5 to 0.7 (exclusive) was determined as "good"; one that was less than 0.5 was determined as "poor".

These evaluation results are collectively shown in Table 1.

TABLE 1

| Sample No. | Initial layer and multilayer stack ($\times10^{18}$ $cm^{-3}$) | | Doping layer ($\times10^{18}$ $cm^{-3}$) | | Leakage property | Current collapse property |
|---|---|---|---|---|---|---|
| | Carbon concentration | Si concentration | Carbon concentration | Si concentration | | |
| 1 | 10 | 0.01 | 0.1 | 1 | Poor | Excellent |
| 2 | 10 | 0.01 | 10 | 1 | Excellent | Excellent |
| 3 | 10 | 0.01 | 50 | 1 | Excellent | Excellent |
| 4 | 10 | 0.01 | 1000 | 1 | Excellent | Excellent |
| 5 | 10 | 0.01 | 2000 | 1 | Good | Good |
| 6 | 10 | 0.01 | 10 | 0.01 | Excellent | Poor |
| 7 | 10 | 0.01 | 10 | 0.1 | Excellent | Excellent |
| 8 | 10 | 0.01 | 10 | 100 | Excellent | Excellent |
| 9 | 10 | 0.01 | 10 | 500 | Good | Good |
| 10 | 10 | 0.01 | 0.1 | 1 | Poor | Good |
| 11 | 10 | 1 | 10 | 1 | Excellent | Excellent |
| 12 | 10 | 1 | 100 | 1 | Excellent | Excellent |
| 13 | 10 | 0.01 | 2000 | 1 | Good | Good |
| 14 | 10 | 0.01 | 10 | 0.01 | Excellent | Poor |
| 15 | 10 | 1 | 10 | 0.1 | Excellent | Excellent |
| 16 | 10 | 1 | 10 | 100 | Excellent | Excellent |
| 17 | 10 | 0.01 | 10 | 500 | Good | Good |

As can be seen from the evaluation results shown in Table 1, it was confirmed that the leakage property and a current collapse property were very good in the case where a carbon concentration in the doping layer was $1\times10^{18}$ to $1\times10^{21}$ $cm^{-3}$ and a Si concentration was $1\times10^{17}$ to $1\times10^{20}$ $cm^{-3}$ (Samples 2 to 4, 7, 8, 11, 12, 15, 16).

Further, the dislocation density in the doping layer was examined by transmission electron microscope observation; it was confirmed that, compared with those in which both the initial layer and the multilayer stack had a carbon concentration of $1\times10^{18}$ to $1\times10^{21}$ $cm^{-3}$ and a Si concentration of $1\times10^{17}$ to $1\times10^{20}$ $cm^{-3}$ (Samples 11, 12, 15, and 16), the dislocation density was around 20% lower than those in which either the carbon concentration or the Si concentration was out of the above-mentioned range (Samples 2 to 4), which was more preferred.

Experiment 2

On the basis of the element (equivalent to Sample 3) where the initial layer 22 and the multilayer stack 23 in Experiment 1 had a carbon concentration of $1\times10^{19}$ $cm^{-3}$ and a Si concentration of $1\times10^{16}$ $cm^{-3}$, and the doping layer 21 had a carbon concentration of $5\times10^{19}$ $cm^{-3}$ and a Si concentration of $1\times10^{18}$ $cm^{-3}$, a ratio of the thickness of the doping layer 21 to the total thickness of the buffer layer 2 was changed into a percentage of each sample as shown in Table 2 below. The conditions other than those were the same as those for Sample 3 in Experiment 1, and the evaluation was carried out.

These evaluation results are collectively shown in Table 2.

TABLE 2

| Sample No. | Thickness of doping layer (%) | Leakage property | Current collapse property |
|---|---|---|---|
| 18 | 0 | Poor | Poor |
| 19 | 10 | Good | Poor |
| 20 | 15 | Excellent | Good |
| 21 | 30 | Excellent | Good |
| 22 | 50 | Excellent | Excellent |
| 23 | 80 | Excellent | Excellent |
| 24 | 85 | Excellent | Excellent |
| 25 | 95 | Excellent | Excellent |
| 26 | 100 | Excellent | Excellent |

As can be seen from the evaluation results shown in Table 2, in the case where the ratio (percentage) of the thickness of the doping layer to the total thickness of the buffer layer was 15% or more (Samples 20 to 26), the leakage property and the current collapse property were excellent. Especially in the case of 50% or more (Samples 22 to 26), it was confirmed that the current collapse control effect was more excellent.

When, however, as for the active layer, the crystallinity was evaluated from a rocking curve half-value width by X-ray diffraction, Sample 26 had around 10% lower crystallinity than that of Sample 25 and had an increased dislocation density. From a crystalline point of view, it would not be preferable that the buffer layer is constituted only by the doping layer.

Experiment 3

On the basis of Sample 3 of Experiment 1, a structure of the doping layer 21 was changed into a multilayer stack structure where a pair of an AlN single crystal layer with a thickness of 5 nm and a GaN single crystal layer with a thickness of 50 nm were repeatedly and alternately deposited to have 10 layers for each (20 layers in total). Other than these, in the same conditions as those for Sample 3 in Experiment 1, an element (Sample 27) was produced and evaluated.

As a result, although the leakage property and current collapse property of Sample 27 were almost equivalent to those of Sample 3, when a 100 μm square in the center of the substrate was observed by the transmission electron microscope, it was confirmed that the number of penetration dislocations in which the dislocations generated in the interface between the silicon single crystal substrate and the buffer layer reached the active layer was around 10% smaller in Sample 27, which was more preferred.

Experiment 4

Figure 3A:
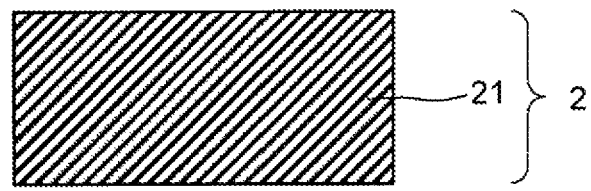
FIGS. 3A to 3D are schematic sectional views showing examples of arrangements of a doping layer in the buffer layer.
Figure 3B:
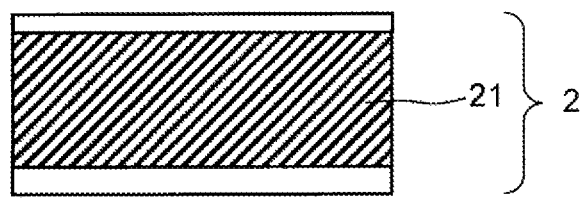
Figure 3C:
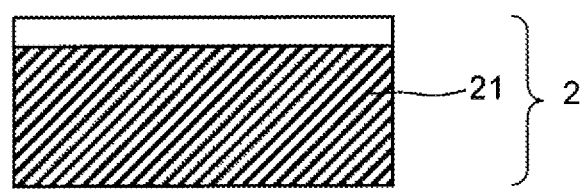
Figure 3D:
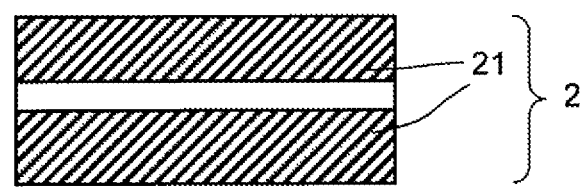

On the basis of Sample 3 of Experiment 1, respective elements were produced for the case where the doping layer 21 was arranged at the uppermost layer in the buffer layer 2 as shown in FIG. 1 (Sample 28), for the case where it was arranged at the lowermost layer as shown in FIG. 3C (Sample 29), and for the case where it was arranged in an intermediate layer as shown in FIG. 3B (Sample 30). Except the arrangements of the doping layer 21, the conditions were the same as those for Sample 3 of Experiment 1, and Samples were evaluated.

These evaluation results are collectively shown in Table 3.

TABLE 3

| Sample No. | Arrangement of doping layer | Leakage property | Current collapse property |
|---|---|---|---|
| 28 | Uppermost layer (FIG. 1) | Excellent | Excellent |
| 29 | Lowermost layer (FIG. 3C) | Excellent | Excellent |
| 30 | Intermediate layer (FIG. 3B) | Excellent | Excellent |

As can be seen from the evaluation results shown in Table 3, the leakage property and the current collapse property were excellent in any arrangement of the doping layer 21 in the buffer layer 2. In particular, it was confirmed that it was preferably the case that the doping layer was in contact with the active layer (Sample 28) in respect of horizontal leakage in the device.

Further, when a 100 μm square in the center of the substrate was observed by the transmission electron microscope; as for a density of all the dislocations including a penetration dislocation, a screw dislocation, and an edge dislocation which were generated in the interface between the silicon single crystal substrate and the buffer layer, compared with one in which the doping layer was in contact with the silicon single crystal substrate (Sample 29), one in which it was in contact with the active layer (Sample 28) or one in which it was in contact with neither the silicon single crystal substrate nor the active layer and was in the intermediate part of the buffer layer (Sample 30) had around 15% lower dislocation density, thus it was confirmed that it was more preferred in terms of a density of defects.

Experiment 5

On the basis of Sample 3 of Experiment 1, the oxygen concentration in the doping layer 21 was changed into one for each Sample shown Table 4 below. Other than these, in the same conditions as those for Sample 3 in Experiment 1, each element was produced and the collapse property was evaluated.

These evaluation results are collectively shown in Table 4.

TABLE 4

| Sample No. | Oxygen concentration ($\times 10^{18}$ cm$^{-3}$) | Current collapse property |
|---|---|---|
| 31 | 0.1 | Good |
| 32 | 0.5 | Excellent |
| 33 | 1 | Excellent |
| 34 | 5 | Excellent |
| 35 | 10 | Good |

As can be seen from the evaluation results shown in Table 4, in the case where the oxygen concentration in the dopant layer was $1\times10^{17}$ to $1\times10^{19}$ cm$^{-3}$ (Samples 31 to 35), the current collapse property was excellent in any of Samples. In particular, it was confirmed that one in the case where the oxygen concentration was $5\times10^{17}$ to $5\times10^{18}$ cm$^{-3}$ (Samples 32 to 34) had approximately 5% lower dislocation density than those in Samples 31 and 35, which was more preferred.

What is claimed is:

1. A nitride semiconductor substrate, wherein a buffer layer, an active layer, and an electron supply layer, each comprising a group 13 nitride, are stacked one by one on a silicon single crystal substrate,
    said buffer layer has a structure comprising a multilayer stack in which a pair of nitride layers having different concentrations of Al or Ga are repeatedly deposited a plurality of times on an initial layer of $Al_xGa_{1-x}N$ (0≤x≤1),
    said buffer layer further comprises a doping layer whose carbon concentration is $1\times10^{18}$ to $1\times10^{21}$ cm$^{-3}$ and whose Si concentration is $1\times10^{17}$ to $1\times10^{20}$ cm$^{-3}$, and
    a thickness of said doping layer is 15% or more of the total thickness of said buffer layer.

2. A nitride semiconductor substrate as claimed in claim 1, wherein said doping layer has a multilayer structure in which a pair of nitride layers having different concentrations of Al or Ga are repeatedly deposited a plurality of times.

3. A nitride semiconductor substrate, wherein a buffer layer, an active layer, and an electron supply layer, each comprising a group 13 nitride, are stacked one by one on a silicon single crystal substrate,
    said buffer layer has a structure comprising a multilayer stack in which a pair of nitride layers having different concentrations of Al or Ga are repeatedly deposited a plurality of times on an initial layer of $Al_xGa_{1-x}N$ (0≤x≤1), and further comprises a doping layer whose carbon concentration is $1\times10^{18}$ to $1\times10^{21}$ cm$^{-3}$ and whose Si concentration is $1\times10^{17}$ to $1\times10^{20}$ cm$^{-3}$,
    a thickness of said doping layer is 15% or more of the total thickness of said buffer layer, and
    an oxygen concentration in said buffer layer is $5\times10^{17}$ to $5\times10^{18}$ cm$^{-3}$.

4. A nitride semiconductor substrate, wherein a buffer layer, an active layer, and an electron supply layer, each comprising a group 13 nitride, are stacked one by one on a silicon single crystal substrate, said buffer layer has a structure comprising a multilayer stack in which a pair of nitride layers having different concentrations of Al or Ga are repeatedly deposited a plurality of times on an initial layer of $Al_xGa_{1-x}N$ ($0 \leq x \leq 1$), and further comprises a doping layer whose carbon concentration is $1 \times 10^{18}$ to $1 \times 10^{21}$ cm$^{-3}$ and whose Si concentration is $1 \times 10^{17}$ to $1 \times 10^{20}$ cm$^{-3}$, said doping layer has a multilayer structure in which a pair of nitride layers having different concentrations of Al or Ga are repeatedly deposited a plurality of times, a thickness of said doping layer is 15% or more of the total thickness of said buffer layer, and an oxygen concentration in said buffer layer is $5 \times 10^{17}$ to $5 \times 10^{18}$ cm$^{-3}$.

* * * * *